United States Patent
Jacobs (10) Patent No.: US 7,567,339 B2
(45) Date of Patent: Jul. 28, 2009

(54) LITHOGRAPHIC APPARATUS WITH GAS BEARING SUPPLY MECHANISM AND DEVICE MANUFACTURING METHOD

(75) Inventor: Hernes Jacobs, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 418 days.

(21) Appl. No.: 11/517,577

(22) Filed: Sep. 8, 2006

(65) Prior Publication Data

US 2008/0062388 A1    Mar. 13, 2008

(51) Int. Cl.
G03B 27/58    (2006.01)
G03B 27/62    (2006.01)

(52) U.S. Cl. .......................... 355/72; 355/75

(58) Field of Classification Search ............. 355/72–76, 355/53; 378/34, 35; 310/10, 12; 318/649, 318/687

See application file for complete search history.

(56) References Cited

U.S. PATENT DOCUMENTS 7,184,123 B2    2/2007    Duisters et al.
7,359,032 B2 *  4/2008    Dansberg et al. .............. 355/53

* cited by examiner

*Primary Examiner*—Hung Henry Nguyen
(74) *Attorney, Agent, or Firm*—Sterne, Kessler, Goldstein & Fox P.L.L.C.

(57) ABSTRACT

A lithographic apparatus is disclosed that has a track comprising a plurality of gas outflow openings positioned along the track. A gas conduit is configured to feed pressurized gas to the gas outflow openings to form a gas bearing configured to moveably bear an object along the track. Further, a gas flow device is provided that is configured to cause or prevent flow of gas through one or more of the gas outflow openings dependent on a position of a guide surface of the object with respect to the gas outflow openings.

18 Claims, 7 Drawing Sheets

LITHOGRAPHIC APPARATUS WITH GAS BEARING SUPPLY MECHANISM AND DEVICE MANUFACTURING METHOD

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In current lithographic apparatus, one or more movable parts of the apparatus may be provided with a gas (e.g., air) bearing. In order to provide such a gas bearing with pressurized gas, a movable part which travels a relatively long distance typically has a flexible gas supply cable loop connected thereto.

However, the cable loop can consume significant design space and may cause disturbance forces towards one or more components attached to the cable loop. This may disturb the critical process of lithographic manufacture. Furthermore, the gas supply cable loop may have a limited lifetime.

For a movable part that moves a relatively short distance, a supply groove may be made in a track used to guide the movable part, and thus avoid use of a gas supply cable loop. For relatively long travel distances, this may not be possible.

SUMMARY

Accordingly, it would be advantageous, for example, to provide a lithographic apparatus in which a movable object may be guided with a gas bearing which is supplied with pressurized gas using an improved gas supply mechanism.

According to an embodiment of the invention, there is provided a lithographic apparatus configured to transfer a pattern onto a substrate, comprising:

a support structure constructed to hold a patterning device, the patterning device configured to provide the pattern;

a substrate table constructed to hold the substrate;

a track comprising a plurality of gas outflow openings positioned along the track;

a gas conduit configured to feed pressurized gas to the gas outflow openings to form a gas bearing configured to movably bear an object along the track; and a gas flow device configured to cause or prevent flow of gas through one or more of the gas outflow openings dependent on a position of a guide surface of the object with respect to the gas outflow openings.

According to an embodiment of the invention, there is provided a device manufacturing method, comprising:

movably bearing an object along a track which is provided with several operable gas outflow openings positioned along the track;

feeding pressurized gas to the gas outflow openings;

causing or preventing flow of gas through the gas outflow openings dependent on a position of a guide surface of the object with respect to the gas outflow openings along the track; and transferring a pattern from a patterning device onto a target portion of a substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
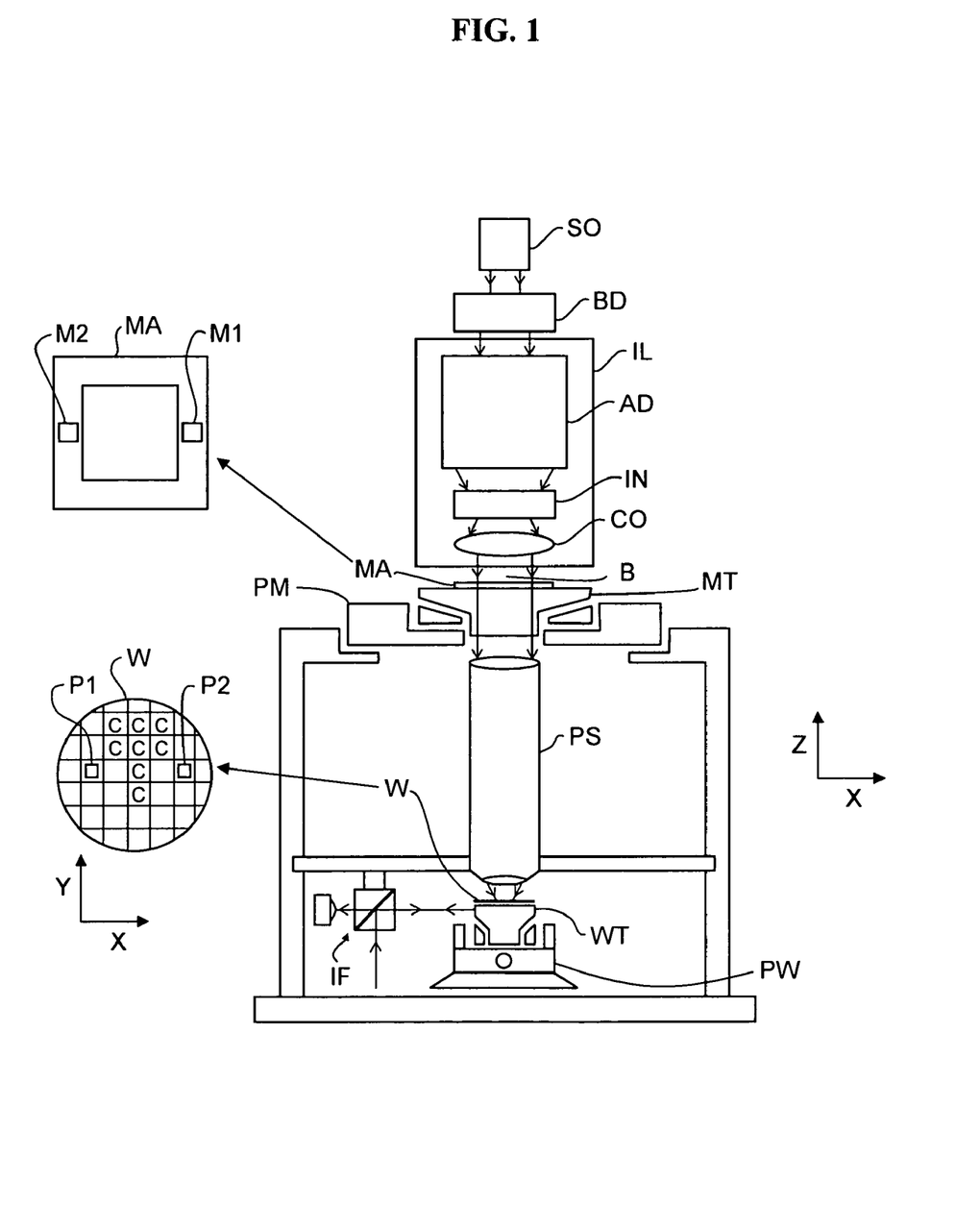
FIG. 1 depicts a lithographic apparatus according to an embodiment of the invention.

FIG. 1 schematically depicts a lithographic apparatus according to an embodiment of the invention. The apparatus includes an illumination system (illuminator) IL configured to condition a radiation beam B (e.g. UV radiation or any other suitable radiation), a support structure (e.g. a mask table) MT constructed to hold a patterning device (e.g., a mask) MA and connected to a first positioning device PM configured to accurately position the patterning device in accordance with certain parameters. The apparatus also includes a substrate table (e.g. a wafer table) WT constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device support structures). In such "multiple stage" machines, the additional tables or support structures may be used in parallel, or preparatory steps may be carried out on one or more tables or support structures while one or more other tables or support structures are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation supply system.

The illuminator IL may include an adjuster AD configured to adjust the angular intensity distribution of the radiation beam. Generally, at least the outer and/or inner radial extent (commonly referred to as $\sigma$-outer and $\sigma$-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioning device PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above-described modes of use or entirely different modes of use may also be employed.

Figure 2:
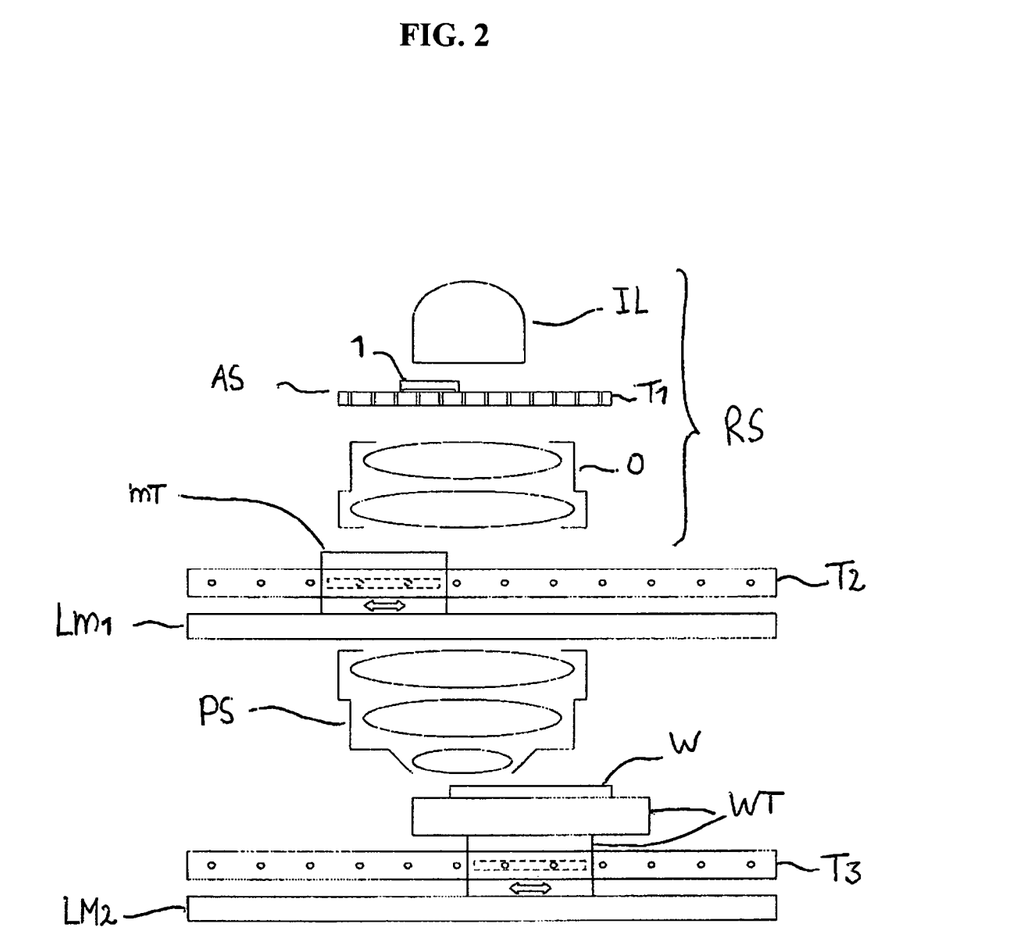
FIG. 2 shows a schematic view of the lithographic apparatus of FIG. 1 incorporating three movable objects thereof with a gas bearing according to an embodiment of the invention.

In FIG. 2 an embodiment of a gas bearing supply system according to an embodiment of the present invention incorporated in the lithographic apparatus of FIG. 1 is shown, in which corresponding elements have been given the same reference signs. Radiation system RS comprises illuminator IL, an aperture stage AS and optics O. The aperture stage AS comprises a track T1 over which a movable object 1 is guided. The movable object 1 may, for example, carry some kind of diaphragm, which is to be moved accurately in order to condition the radiation coming from the illuminator IL.

Beneath the optics O the support structure MT is provided, which support structure MT is movably guided along a track T2. A linear motor LM1 is provided for accurately moving the support structure MT in, for example, the longitudinal direction of the track T2. Downstream of the support structure MT, the projection system PS is provided. From there the conditioned radiation beam is delivered to the substrate W which is held by the substrate table WT. The substrate table WT is movably guided over a track T3. A linear motor LM2 is provided to accurately move the substrate table WT in, for example, the longitudinal direction of the track T3.

The aperture stage, the patterning device stage and the substrate stage, may each be provided with an integrated gas bearing supply system according to an embodiment of the invention which is described in more detail below with reference to FIG. 3.

Figure 3A:
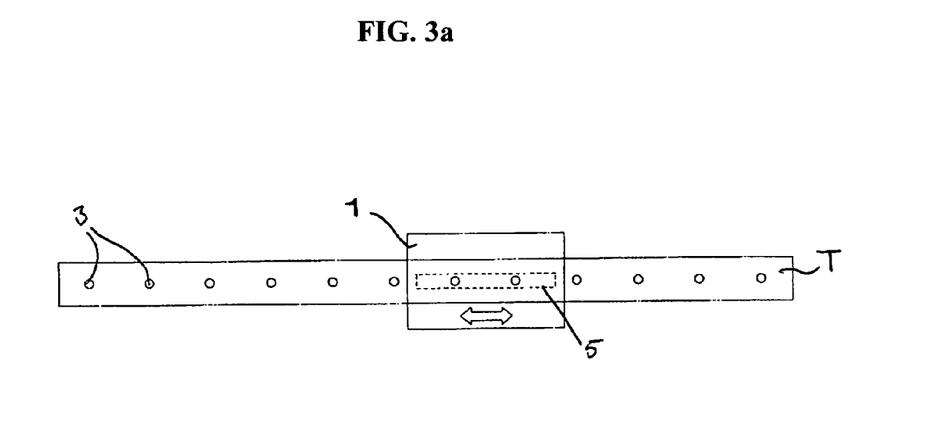
FIGS. 3a and 3b show a top view and side view respectively of one of the movable objects with the gas bearing of FIG. 2.
Figure 3B:
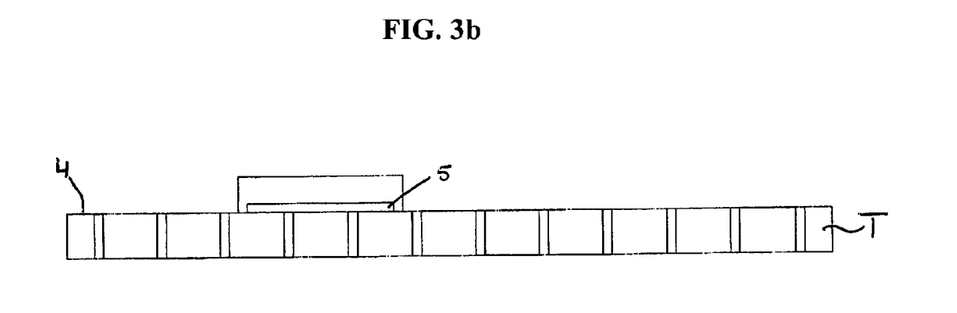

In FIG. 3 it can be seen that the track T comprises several gas outflow openings 3. Referring to FIG. 3b, the top surface of the track T forms a guide surface 4. The movable object 1 (e.g., aperture stage AS, patterning device support structure MT, and/or substrate table WT) comprises a supply groove 5 in its guide surface which lies opposite the guide surface 4 of the track T. During use, pressurized gas can be blown into the supply groove 5 via one or more of the gas outflow openings 3 which in that particular position of the movable object 1, with respect to the track T, lie opposite the supply groove 5. For this purpose the gas outflow openings 3 are connected with a gas conduit 6 configured to feed pressurized gas (see FIG. 4a) from a gas supply. Thus, a gas bearing is formed between the movable object 1 and the track T.

Because the desired stroke of the movable object 1 is much larger than the length of the movable object 1, the gas outflow openings 3 are provided with one or more valves configured to open and close the gas outflow openings. In particular, the opening and closing is performed by one or more valves dependent on the position of the guide surface of the movable object 1 with respect to the gas outflow openings 3 along the track T. For example, one or more of the valves may comprise an operable valve which will be described in more detail below with reference to FIG. 4.

Advantageously, the one or more valves are constructed to open at least one of the gas outflow openings 3 between the guide surfaces of the movable object 1 and the track T when, at the time, the at least one of the gas outflow openings 3 lies opposite the supply groove 5 of movable object 1. The remaining gas outflow openings 3, that is to say those gas outflow openings 3 which do not lie opposite the supply groove 5 at a particular moment in time, may remain closed. In an embodiment, the opening and closing of the gas outflow openings 3 is done automatically by the one or more valves, in particular triggered by the movable object 1 itself (or a part thereof).

The gas outflow openings 3 are provided with a specific pitch in the track T. This pitch is chosen such that, for each position of the movable object 1 along the track T, the supply groove 5 lies in a position opposite to at least one of the gas outflow openings 3. In particular the pitch is chosen such that it is smaller than the length of the guide surface of the movable object 1, and more in particular the pitch is chosen such that it is smaller than the length of the supply groove 5. In the embodiment of FIG. 3, the pitch is chosen such that at least two of the gas outflow openings 3 lie opposite the supply groove 5. A larger number of gas outflow openings are also possible.

Figure 4A:
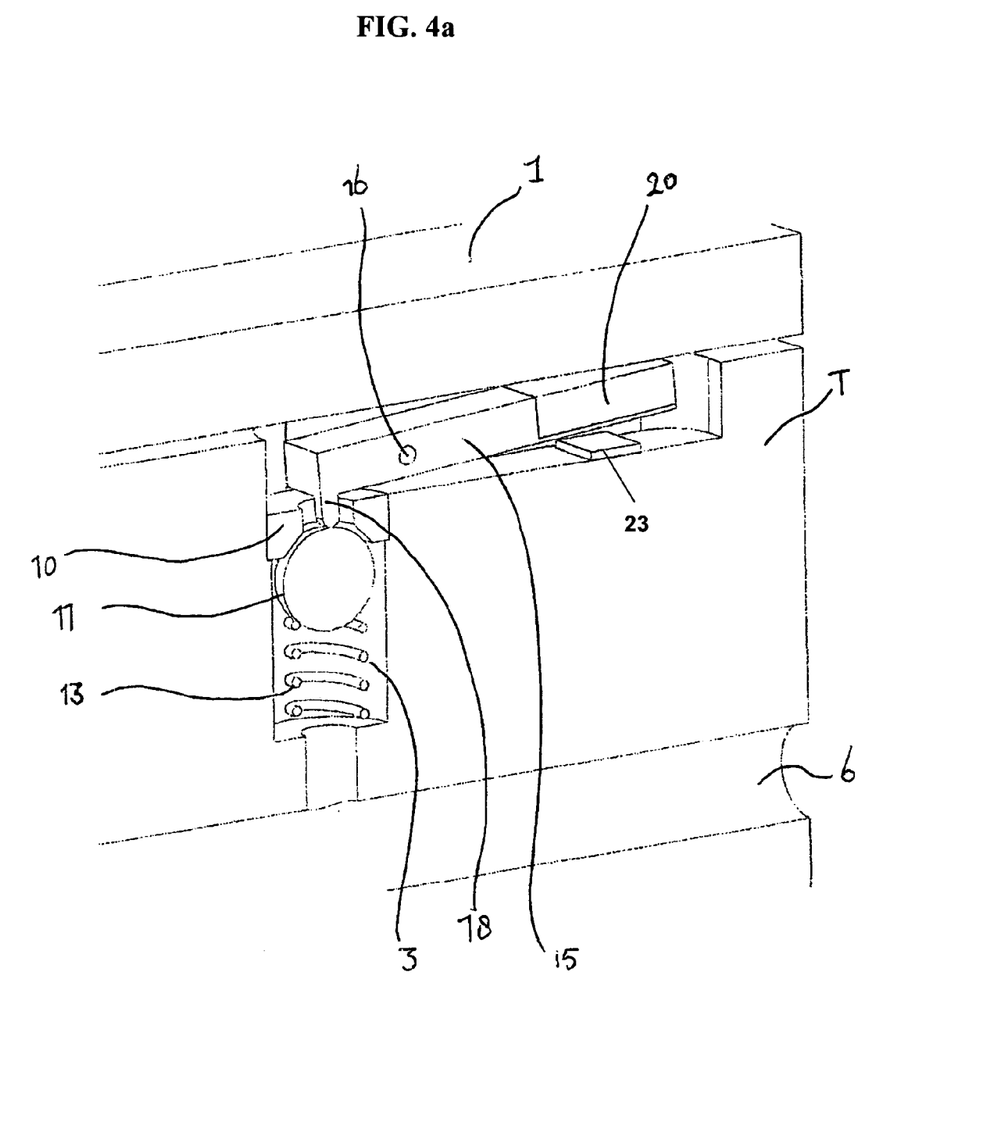
FIGS. 4a and 4b show an open and closed position respectively of a magnetically actuated valve in a gas bearing according to an embodiment of the invention.
Figure 4B:
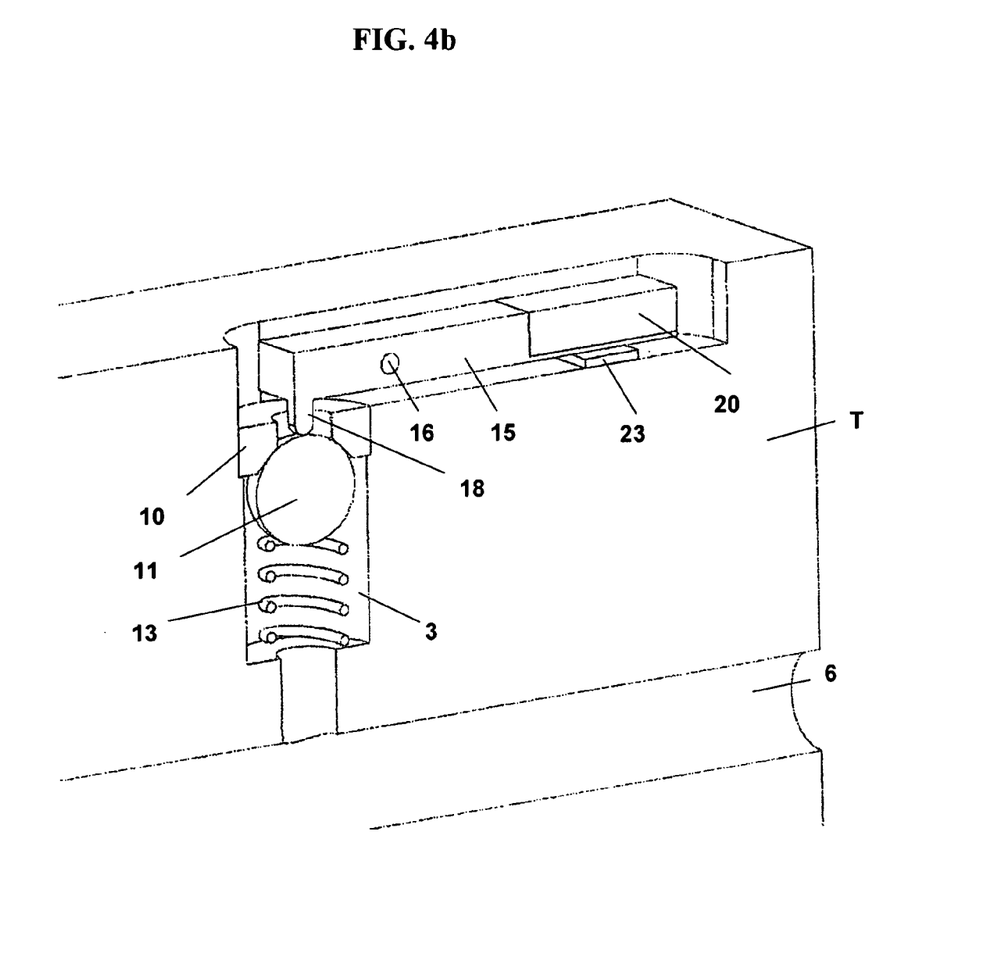

FIG. 4 shows an embodiment of a magnetically actuated valve, provided for a gas outflow opening 3, which automatically opens when the movable object 1 comes to lie above this particular gas outflow opening 3. See FIG. 4a. The valve comprises a seat 10 in the direction of which a piece (e.g., at least partly spherical shape) 11 is biased by means of a spring 13. A lever 15 is provided to rotate around an axis 16. The left end of the lever 15 comprises a push element 18 which is able to push the piece 11 into an open position against the biasing force of the spring 13. Thus, a clearance is formed between the seat 10 and the piece 11 via which pressurized gas from the gas conduit 6 may flow towards the space between the guide surface of the movable object 1 and the guide surface 4 of the track T. The anti-clockwise rotation of the lever 15, which is used to push the piece II downwards to its open position, is automatically achieved by the fact that a magnet 20 is provided at the free right end of the lever 15. This magnet is attracted by the movable object 1 as soon as it comes to lie above the lever 15. For this purpose, the movable object 1 is at least partially made out of steel (or other magnetizable material), an electromagnetic coil, or the like. Similarly, the free right end of the lever may be made out of steel (or other magnetizable material), an electromagnetic coil, or the like while the object 1 comprises a magnet adjacent the guide surface of the movable object 1. As soon as the movable object 1 has moved towards a position past the magnet 20, the lever 15 automatically rotates clockwise back to its original position. See FIG. 4b. This is achieved by gravitational force acting on the lever 15, as well as by the biasing force of the spring 13. At the same time, the piece 11 moves back towards its closed position against the seat 10, and thus closes the gas outflow opening 3. This is achieved by the biasing force of the spring 13, and by the pressurized gas coming from the gas conduit 6.

Beneath the part of the lever 15 where the magnet 20 is provided, a metal element 23 is mounted. This metal element 23 does not stand in the way of the lever 15 rotating towards its open position as soon as the movable object 1 is above it, but has an advantage that it prevents flapping of the valve when the movable object 1 has only partly moved to a position opposite the magnet 20. In that particular situation, the valve has two bi-stable positions, and together with the lever 15 is able to remain in its original closed position.

Figure 5A:
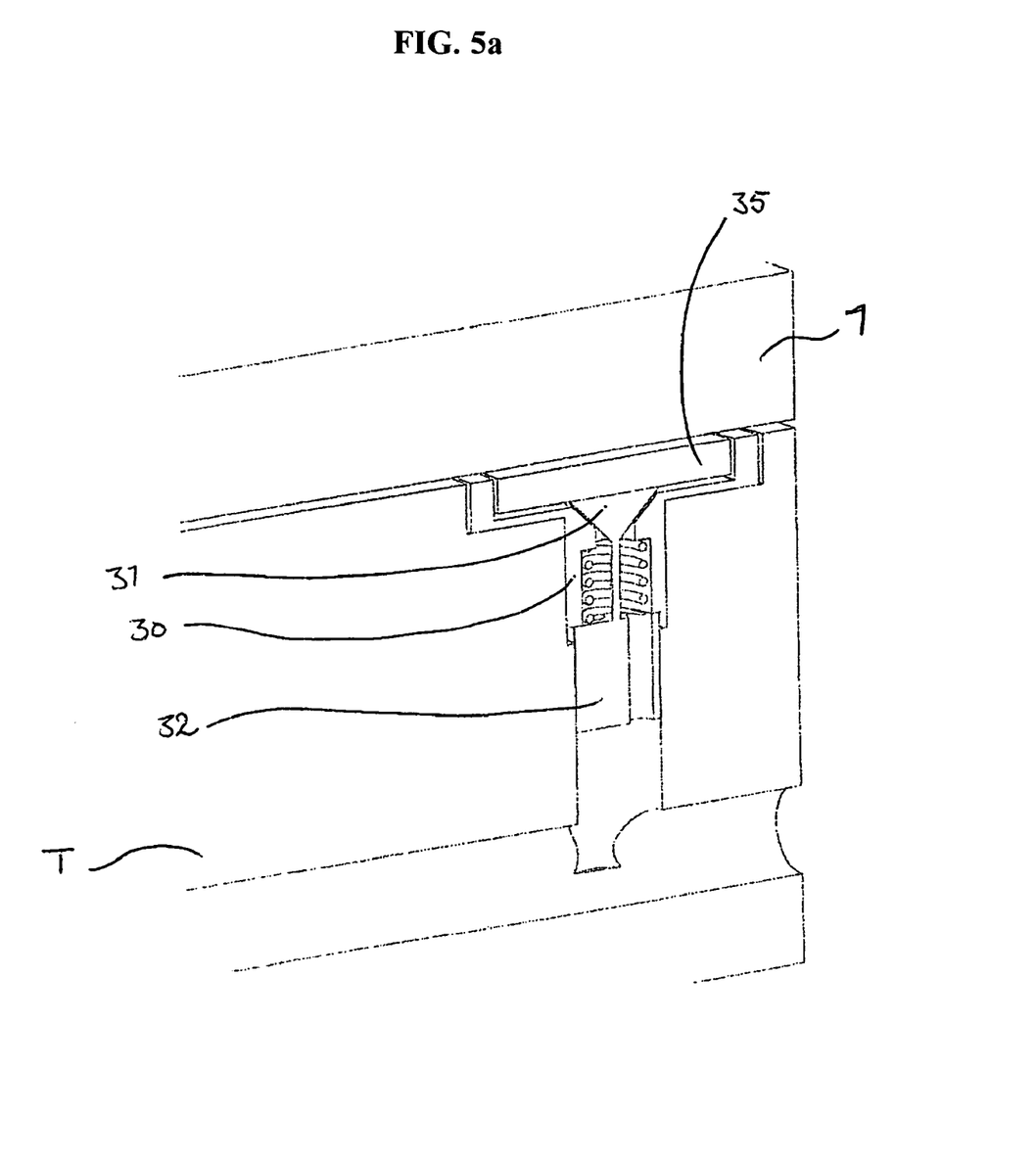
FIGS. 5a and 5b show an open and closed position respectively for an alternative embodiment of the magnetically actuated valve of FIG. 4.
Figure 5B:
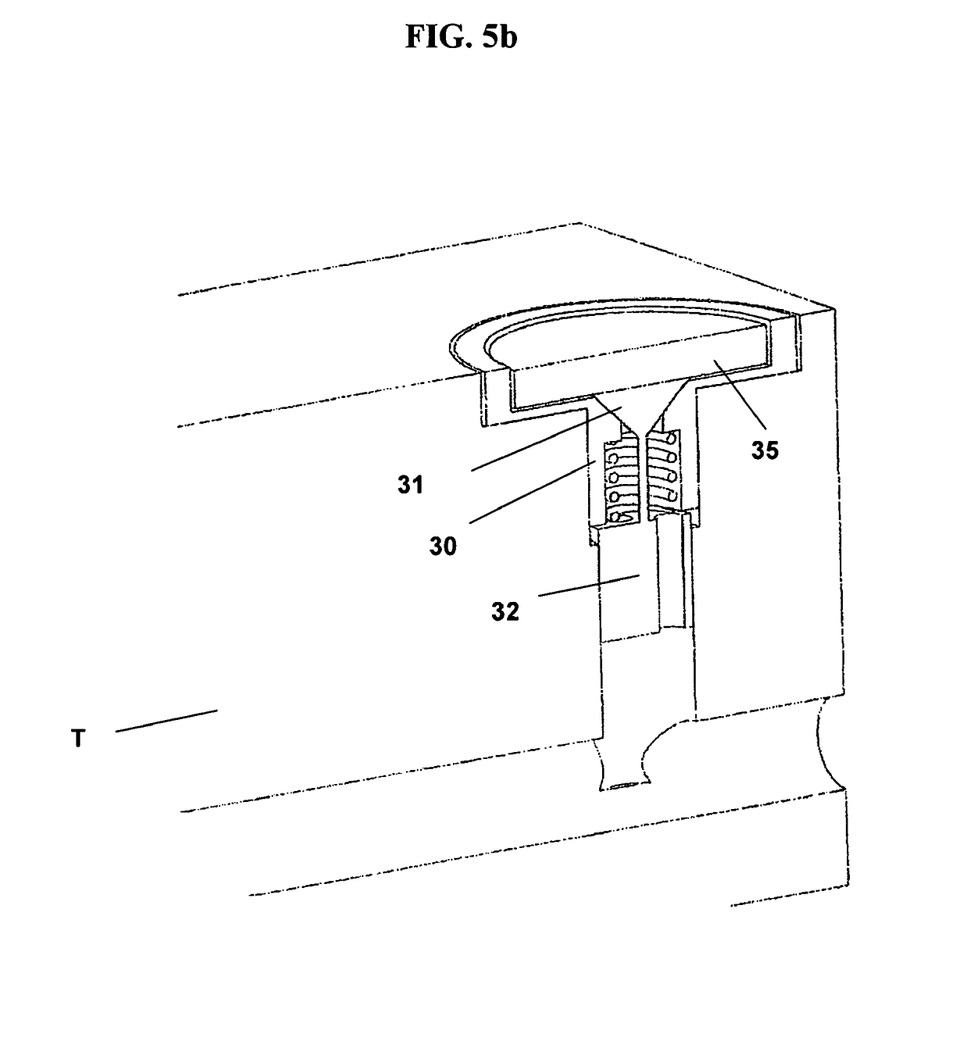

FIG. 5 shows an alternative embodiment in which the gas outflow opening 3 comprises a seat 30 against which a piece 31 may rest in a closed position. See FIG. 5b. In this closed position, the piece 31 is pulled downward by a spring 33 acting on the piece 31 using a pull member 32. The pull member 32 is provided downstream of both the piece 31 and the spring 33, and is connected with the piece 31 by means of a slender shaft element. The piece 31 is connected to a magnet 35. When the movable object 1 is near, that is to say comes to lie in a position opposite the magnet 35, the magnet 35 attracts towards the movable object 1. Because the magnet 35 is connected with the piece 31, it automatically moves the piece 31 out of the seat 30 towards an open position so that gas may flow out. See FIG. 5a. As soon as the movable object 1 has moved to a position past the magnet 35, the piece 31 automatically closes again because of the biasing spring force of the spring 33. The embodiment of FIG. 5 has an advantage that the piece 31 is able to automatically move towards its open position in the case that the gas pressure becomes too high.

Both the valve mechanisms shown in FIGS. 4 and 5 have an advantage that they can easily be mounted from the side of the guide surface of the track. This is also advantageous for maintenance on the mechanism if desired.

Besides the embodiments shown, many alternative or additional embodiments are possible. For example, the gas flow device (e.g., comprising the valve described above) may be instead or additionally comprise a device to achieve a full disconnection between the gas supply and the respective gas outflow opening(s). In an embodiment, the gas flow device may instead or additionally comprise individual gas pressurizing mechanisms (e.g., a small pump) provided for each gas outflow opening, and comprise a switch to turn the individual gas pressurizing mechanisms on or off. In an embodiment, the gas flow device may instead or additionally comprise a flexible duct in a path towards one or more of the gas outflow openings, and comprise a mechanism to press the duct together or release it. In an embodiment of the gas flow device with the valve described above, the gas flow device may comprise additional mechanisms and structure, such as a channel, a pump, etc.

Further, the track can be straight, but also may include curved parts. The track may have a particular length, but also may have a loop shape and thus form an infinite track. In an embodiment, the gas bearing is used in combination with a linear drive. Thanks to the gas bearing with the gas supply mechanism described herein accurate moving and positioning may be possible. Less or even no friction forces may occur, enabling the movable object to be accurately displaced along the track, for example by means of the linear drive. Besides using a gas bearing with the gas supply mechanism described herein for the aperture stage, the patterning device stage and/or the substrate stage, it may also be used for one or more other movable objects of the lithographic apparatus, in particular a movable object with a long stroke. Instead of ambient gas, another gas medium may be supplied towards the gas bearing.

Instead of magnetic operation as described herein, one or more other kinds of triggering may be provided to open and close the gas outflow openings. For example, one or more sensors may be provided along the track, giving a signal towards a controller as soon as the movable object is detected at a particular position. The controller then sends out a signal towards a drive to open or close a respective gas outflow opening, whichever is desired.

A valve operating mechanism with a magnet and/or sensor has an advantage that no direct contact needs to be made between the movable object and the mechanism. Thus, no wear and no contamination may take place. Also the friction value of the movable object/track arrangement may not change. The influence of a magnet and/or sensor on the movable object is constant and easily derivable, and thus may easily be corrected by a corresponding steering of the drive.

A movable object may also be provided with more than one guide surface to guide the object along a track with a corresponding number of guide surfaces. For example, the movable object might be constructed with three U-shaped guide surfaces to enclose a track. In that case, one or more of the guide surfaces of the track might be provided with a set of operable gas outflow openings as described herein.

Thus, according to an embodiment of the present invention, a gas bearing is provided for a lithographic apparatus, in which a gas supply mechanism with operable gas outflow openings is advantageously integrated in a track of the gas bearing. The mechanism may have a slim design, have low disturbance forces, and achieve a cost saving, for example because no cable loop needs to be provided. The gas supply mechanism may have a long lifetime and extend and/or improve the performance of the lithographic apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams. The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus configured to transfer a pattern onto a substrate, comprising:
    a support structure constructed to hold a patterning device, the patterning device configured to provide the pattern;
    a substrate table constructed to hold the substrate;
    a track comprising a plurality of gas outflow openings positioned along the track;
    a gas conduit configured to feed pressurized gas to the gas outflow openings to form a gas bearing configured to movably bear an object along the track; and
    a gas flow device configured to cause or prevent flow of gas through one or more of the gas outflow openings dependent on a position of a guide surface of the object with respect to the gas outflow openings, wherein a flow of gas is caused through at least one of the gas outflow openings when the at least one of the gas outflow openings lies opposite the guide surface of the object, and a flow of gas is prevented through the remaining ones of the gas outflow openings.

2. The apparatus of claim 1, wherein, for substantially each position of the object along the track, the guide surface of the object lies in a position opposite at least one of the gas outflow openings.

3. The apparatus of claim 1, further comprising a groove provided in the guide surface of the object and configured to receive gas via at least one of the gas outflow openings during movement of the object along the track.

4. The apparatus of claim 3, wherein the gas outflow openings are provided at distances from each other which are smaller than a length of the groove.

5. The apparatus of claim 1, wherein the gas outflow openings are provided at distances from each other which are smaller than a length of the guide surface of the object.

6. The apparatus of claim 1, wherein the gas flow device comprises an operable valve provided for each of the gas outflow openings.

7. The apparatus of claim 6, wherein each valve is magnetically operated.

8. The apparatus of claim 1, wherein the object comprises a triggering mechanism to automatically cause flow of gas through a respective one of the gas outflow openings when the object has moved to a position opposite to the respective one of the gas outflow openings.

9. The apparatus of claim 1, wherein the object is the substrate table.

10. The apparatus of claim 1, wherein the object is the support structure.

11. The apparatus of claim 1, wherein the object is an aperture stage provided between an illuminator of the apparatus and the support structure.

12. A device manufacturing method, comprising:
    movably bearing an object along a track which is provided with several operable gas outflow openings positioned along the track;
    feeding pressurized gas to the gas outflow openings;
    causing or preventing flow of gas through the gas outflow openings dependent on a position of a guide surface of the object with respect to the gas outflow openings along the track, wherein a flow of gas is caused through at least one of the gas outflow openings when the at least one of the gas outflow openings lies opposite the guide surface of the object, and a flow of gas is prevented through the remaining ones of the gas outflow openings; and
    transferring a pattern from a patterning device onto a target portion of a substrate.

13. The method of claim 12, wherein the causing or preventing is performed using an operable valve provided for each of the gas outflow openings.

14. The method of claim 13, further comprising magnetically operating the valve.

15. The method of claim 12, further comprising automatically causing a flow of gas through a respective one of the gas outflow openings when the object has moved to a position opposite to the respective one of the gas outflow openings.

16. The method of claim 12, wherein the object is a substrate table holding the substrate.

17. The method of claim 12, wherein the object is a support structure holding the patterning device.

18. The method of claim 12, wherein the object is an aperture stage provided between an illuminator used to condition radiation for exposure transferring of the pattern and a support holding the patterning device.

* * * * *